United States Patent
Shimazaki

(10) Patent No.: US 6,204,699 B1
(45) Date of Patent: Mar. 20, 2001

(54) VOLTAGE DETECTION CIRCUIT

(75) Inventor: Mamoru Shimazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/263,883

(22) Filed: Mar. 8, 1999

(30) Foreign Application Priority Data

Mar. 10, 1998 (JP) .................................................. 10-078299

(51) Int. Cl.[7] .................................................. H03K 5/153
(52) U.S. Cl. .................................. 327/72; 327/74; 327/63
(58) Field of Search .............................. 327/50, 63, 64, 327/72, 73, 77, 78, 407, 408, 74, 75, 76, 79, 80, 81, 82, 88, 89

(56) References Cited

U.S. PATENT DOCUMENTS

| | | | |
|---|---|---|---|
| 4,617,473 | * 10/1986 | Bingham | 307/66 |
| 4,626,707 | 12/1986 | Arita et al. | 327/66 |
| 5,378,936 | * 1/1995 | Kokubo et al. | 327/77 |
| 5,451,891 | * 9/1995 | Tanabe | 327/89 |
| 5,548,227 | * 8/1996 | Minami | 326/33 |
| 5,563,546 | * 10/1996 | Tsukada | 327/408 |
| 5,614,857 | * 3/1997 | Lim et al. | 327/205 |

FOREIGN PATENT DOCUMENTS 2 285 316   7/1995   (GB) .

OTHER PUBLICATIONS

European Search dated Jul. 29, 1999.

\* cited by examiner

Primary Examiner—Timothy P. Callahan
Assistant Examiner—Hai L. Nguyen
(74) Attorney, Agent, or Firm—McGuireWoods, LLP

(57) ABSTRACT

A voltage detection circuit is capable of detecting a low voltage without malfunctioning, and this so even if the voltage is lower than a minimum operating voltage. The voltage detection circuit includes two input terminals, a voltage selecting circuit, and a voltage-detecting integrated circuit (IC). In operation, a standard voltage is input into a first input terminal of the voltage detection circuit and the voltage to be detected is input into the second input terminal. The first terminal voltage is then divided by a voltage divider circuit. This divided voltage and the voltage to be detected are input into the voltage selecting circuit, which outputs one of the voltages to the voltage detecting IC. The voltage detecting IC compares the input voltage to a detection voltage and outputs a value accordingly. To ensure that the detection circuit will function properly at all times, the voltage selection circuit inputs the divided voltage into the voltage detecting IC when the voltage to be detected falls below the minimum operating voltage.

22 Claims, 4 Drawing Sheets

PRIOR ART
Fig. 4
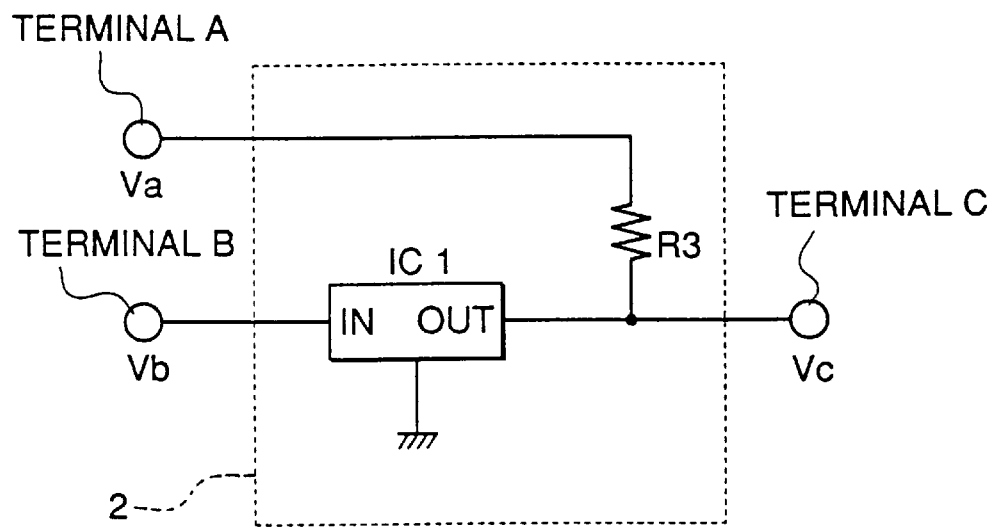
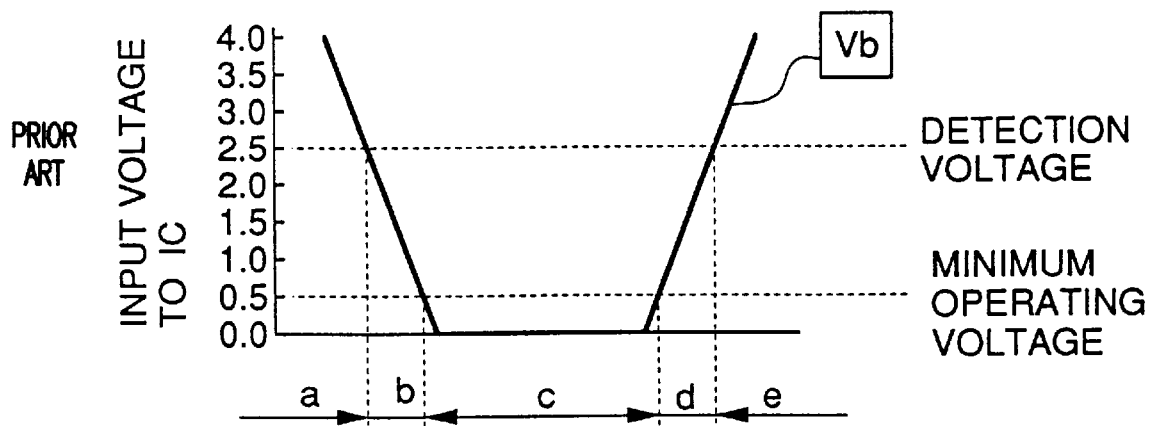
Fig. 5A
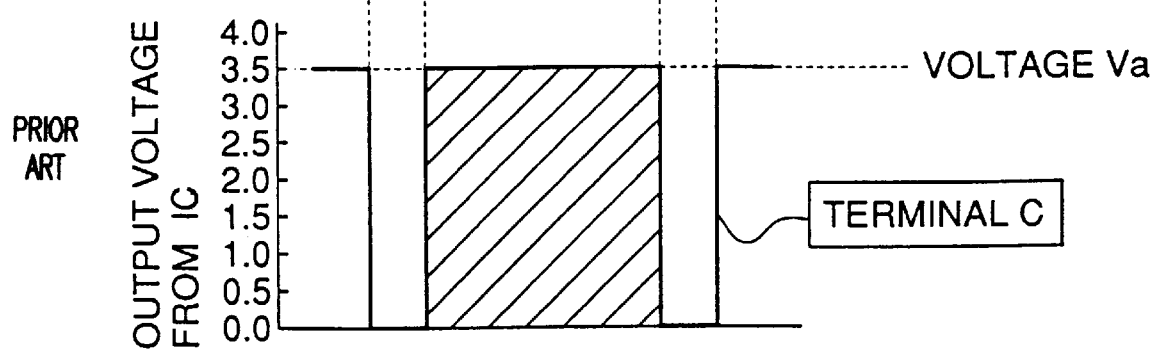
Fig. 5B

VOLTAGE DETECTION CIRCUIT

BACKGROUND OF THE INVENTION

1. Field of the Invention

The present invention relates to a voltage detection circuit which is designed such that a voltage input into a voltage detection IC (Integrated Circuit) does not fall below a minimum operating voltage, so as to be capable of detecting the voltage correctly, while preventing malfunction of the voltage detection IC.

2. Background Art

A voltage detection circuit as shown in FIG. 4 is known as an example of conventional voltage detection circuits.

The voltage detection circuit shown in FIG. 4 will be described hereinafter. The voltage detection circuit 2 has a terminal A and a terminal B, and an external constant voltage source is connected to the terminal A, and a power source for measuring a voltage is connected to the terminal B.

The voltages Va and Vb are applied to terminals A and B, respectively, and the voltage Vb is input into the voltage detection circuit. The output of the voltage detection IC 1 is connected to the terminal A through the pull-up resistor R3. The result of the voltage detection IC 1 is output at a terminal C.

Here, an operation of the voltage detection circuit will be described. As described, the external constant voltage source is connected to the terminal A, and the voltage Va is applied to the terminal A. The terminal B is connected to the power source for measuring the voltage and the voltage Vb is applied to the terminal B.

The terminal B is connected to the voltage detection IC 1, and the voltage Vb is input into the voltage detection IC 1. The output end of the voltage detection IC 1 and the resistor R3 are connected to the terminal C, and the voltage Va is applied to the pull-up resistor R3.

When the voltage Vb is higher than a detection voltage, a voltage at a level of "H" is output at the terminal C, and when the voltage Vb is lower than the detection voltage, a voltage at a level of "L" is output at the terminal C.

Next, the operation is described in more detail using a wave-form diagram shown in FIG. 5. FIG. 5 is a diagram to explain the change of the input and output voltages of the voltage detection circuit.

FIG. 5A shows an input voltage Vb to the terminal B, and the input voltage Vb is input into the voltage detection IC 1. FIG. 5B shows an output voltage of the voltage detection circuit which appears at the terminal C.

In the above figures, it is assumed that the detection voltage of the voltage detection IC 1 is 2.5 V, the minimum operating voltage of the voltage detection IC 1 is 0.5 V, and the voltage Va at the terminal A is 3.5 V.

The region a is a range wherein the voltage Vb is higher than the detection voltage of the voltage detection IC 1. Since the voltage Vb to be input into the voltage detection IC 1 is higher than the detection voltage of the voltage detection IC 1, the level "H" is output at the terminal A.

The region b is a range wherein the voltage Vb is lower than the detection voltage of the voltage detection IC 1, but higher than the minimum operating voltage. Since the voltage Vb to be input in the voltage detection IC 1 is lower than the detection voltage of the voltage detection IC 1, the level "L" is output at the terminal C.

The region c is a range wherein the voltage Vb is lower than the minimum operating voltage of the voltage detection IC 1. Despite the voltage Vb to be input in the voltage detection IC 1 being lower than the detection voltage of the voltage detection IC 1, since the voltage Vb is lower than the minimum operating voltage of the voltage detection IC 1, the terminal voltage becomes unstable and causes a malfunction of the voltage detection IC 1.

The region d is, similar to the region b, a range wherein the voltage Vb is lower than the detection voltage of the voltage detection IC 1. Since the voltage Vb to be input into the voltage detection IC 1 is lower than the detection voltage of the voltage detection circuit IC 1, the level "L" is output at the terminal C.

The region e is, similar to the region a, a range wherein the voltage Vb is higher than the detection voltage of the voltage detection IC 1. Since the voltage to be input in the voltage detection IC 1 is higher than the detection voltage of the voltage detection IC 1, the level "H" is output at the terminal C. Due to the effect of the pull-up resistor R3, the voltage which appears at the terminal C is Va.

As a result, change of the output voltage of the voltage detection IC 1 is obtained as shown in FIG. 5B. The region wherein the output of the voltage detection IC 1 changes is between regions a and b as well as between regions d and e.

However, in the region c, despite the fact that the voltage Vb is lower than the minimum operating voltage of the voltage detecting IC 1, and that the voltage Vb is lower than the detection voltage, a problem arises that it is not possible to execute a normal detection of the voltage in the region c and causes malfunction of the voltage detection IC 1.

Although a reference voltage generating circuit which is capable of setting a very accurate detection level of a source voltage detection circuit is disclosed in Japanese Patent Application, First Publication No. Hei 06-258359, the above described problem is still remains unsolved.

SUMMARY OF THE INVENTION

It is an object of the present invention to solve the above described problem and to provide a voltage detection circuit which is capable of executing the accurate detection of the voltage, while preventing the malfunction of the voltage detection IC, even when the voltage of the terminal for detecting the voltage is lower than the minimum operating voltage of the voltage detection IC.

In order to attain the above object, a voltage detection circuit by the present invention comprises:

a voltage detection IC for outputting a voltage, the level of which is made to correspond to the detection voltage by inputting a voltage which is lower than the detection voltage and which is higher than the minimum operating voltage; and a voltage selection circuit for selecting a higher voltage among two voltages and inputting said voltage into said voltage detection IC.

The voltage detection circuit of the present invention selects a higher voltage among two voltages by the voltage selection circuit, and the thus selected voltage is input into the voltage detection IC.

Since the input voltage into the voltage detection IC is set at a voltage higher than the minimum operating voltage of the voltage detection IC and higher than the detection voltage of the voltage detection IC, it is possible to detect a low voltage, even if the voltage to be detected is lower than the minimum operating voltage of the voltage detection circuit, while preventing the malfunction of the voltage detection IC.

BRIEF DESCRIPTION OF DRAWINGS

FIG. 4 is a circuit diagram showing the structure of the voltage detection circuit of FIG. 3.

FIGS. 5A and 5B are diagrams showing voltage waveforms in order to explain a conventional voltage detection circuit.

DETAILED DESCRIPTION OF PREFERRED EMBODIMENTS

Figure 1:
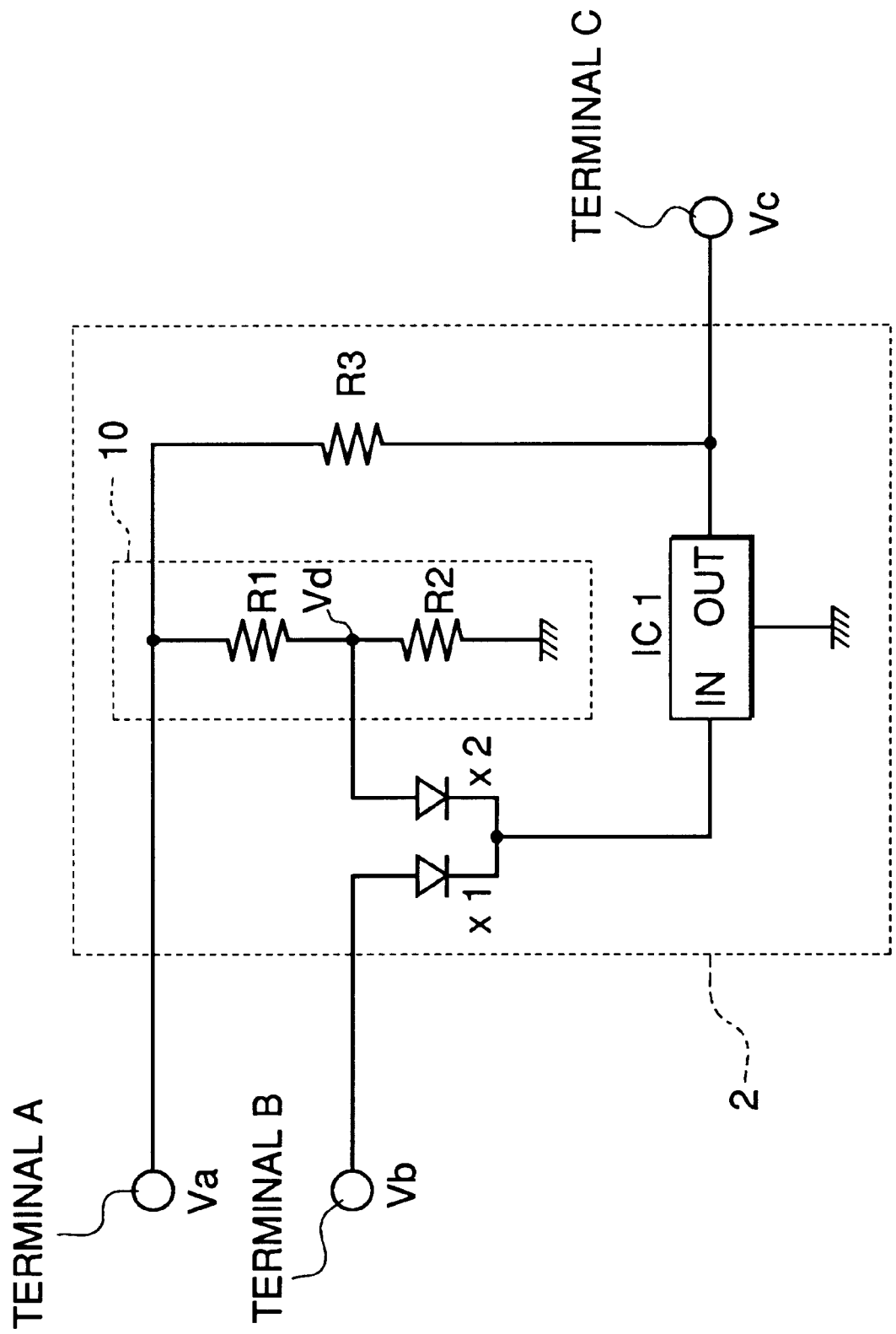
FIG. 1 is a circuit diagram showing the structure of a voltage detection circuit according to the first embodiment of the present invention.

Hereinafter, two preferred embodiments of the voltage detection circuit according to the present invention will be described, with reference to attached drawings. FIG. 1 is a circuit diagram showing the structure of the first embodiment of the present invention.

In FIG. 1, explanations of this voltage detection circuit will be described by attaching reference numerals to the same elements of the conventional voltage detection circuit shown in FIG. 4.

With reference to FIG. 1, the structure of the present voltage detection circuit will be described. The voltage detection circuit 2 has terminals A and B, and a standard voltage source at an outside location is connected to the terminal A, and the power source for measuring a voltage is connected to the terminal B.

It is assumed that the voltage applied to the terminal A is Va, and the voltage applied to the terminal B is Vb. The voltage detection circuit is designed such that a voltage Vd is generated at a junction of resistors R1 and R2 by dividing the voltage Va by connecting the resistors R1 and R2 in series between the terminal A and the GND (ground). A voltage dividing circuit 10 is constructed by these resistors R1 and R2.

The terminal B is connected to an anode of a diode X1 and the junction between resistors R1 and R2 is connected to an anode of a diode X2.

In addition, cathodes of both diode X1 and X2 are connected to each other, and the junction between both cathodes are connected to the input end of a voltage detection IC1.

Those diodes X1 and X2 form a voltage selecting circuit for inputting into the input end of the voltage detection IC 1 an voltage which is a higher voltage selected by comparison between the voltage at the terminal B and the divided voltage Vd at the junction of resistors R1 and R2.

The output of the voltage detection IC 1 is to be connected with the terminal A through the pull-up resistor R3. The output of the voltage detection IC 1 is also connected to the terminal C.

Hereinafter, an operation of the first embodiment as shown above will be described. In order to facilitate an understanding of this embodiment, a schematic operation will be first described.

The voltage Vb at the terminal B in FIG. 1, obtained by connecting the power source, and the voltage Vd, generated by the standard voltage source and then divided by the voltage dividing circuit 10, are input into the voltage detection IC 1 after passing through diodes X1 and X2, respectively.

A higher voltage in either one of Vb and Vd is input into the voltage detection IC 1. This circuit shown in FIG. 1 is designed such that it is capable of preventing the malfunction of the voltage detection IC 1, and is also capable of detecting low voltage, even though the voltage to be detected is less than the minimum operating voltage of the voltage detection IC 1, by setting the voltage Vd to be lower than the detection voltage of the voltage detection IC 1 and to be higher than the minimum operating voltage of the voltage detection IC 1.

Figure 2A:
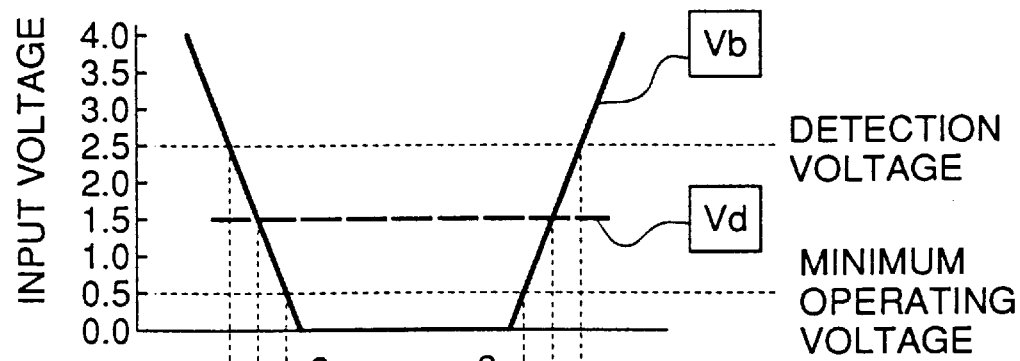
FIGS. 2A, 2B, and 2C are diagrams showing voltage waveforms to explain an operation of the voltage detection circuit shown in FIG. 1.
Figure 2B:
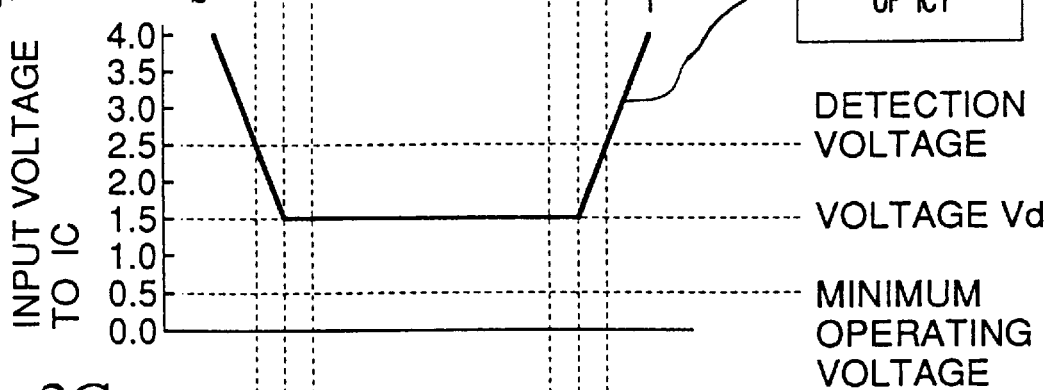
Figure 2C:
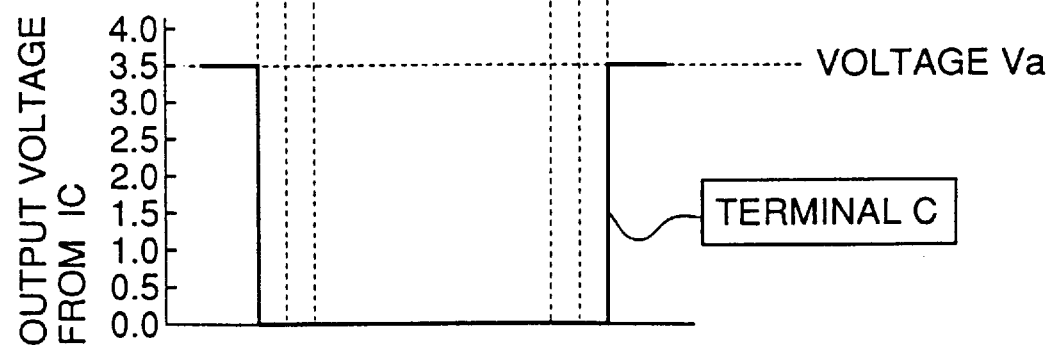

The operation of the circuit shown in FIG. 1 will be described in more detail with reference to FIGS. 2A, 2B, and 2C showing changes of voltages at each terminals. The terminal A is connected to the standard voltage source, and the voltage of the terminal A is represented as Va.

The terminal B is connected to the power source for detecting the voltage, and the voltage of the terminal B is represented as Vb. The voltage Va of the standard voltage source is divided by the voltage dividing circuit 10, which is formed by connecting the resistors R1 and R2 in series between the terminal A and the GND, and the voltage Vd is generated at the junction between the resistors R1 and R2.

Since the voltage Vd is obtained by the division of the voltage generated by the standard voltage source, the voltage Vd is a stabilized voltage and can be used as the reference voltage. The resistance of R1 and R2 is established such that the voltage Vd is lower than the detection voltage of the voltage detection IC 1 and is also higher than the minimum operating voltage of the voltage detection IC 1.

The voltage Vb of the terminal B is applied to the anode of the diode X1, and the voltage Vd, obtained after division by means of R1 and R2, is applied to the anode of the diode X2. The cathode of the diode X1 and the cathode of the diode X2 are commonly connected and connected to the voltage detection IC 1; thereby, the diode X1 and the diode X2 construct a diode OR circuit, so that a higher voltage between the voltages Vb and Vd is input into the voltage detection IC 1.

Furthermore, the diodes X1 and X2 play the role of preventing the higher voltage between the voltages Vb and Vd from flowing from the higher voltage to the lower voltages, so that, when the voltage Vb is higher than the voltage Vd, the current is prevented from flowing from the cathode of the diode X1 toward the anode of the diode X2.

In contrast, when the voltage Vd is higher than the voltage Vb, the OR circuit plays the role of preventing the current from flowing from the cathode of the diode X2 to the anode of the diode X1.

Since the voltage Vd is set at a value lower than the detection voltage of the voltage detection IC 1 but higher than the minimum operation voltage of the voltage detection circuit, it is possible for the voltage detection circuit IC 1 to execute normal detection of a low voltage, without causing a malfunction, because a higher voltage than the minimum operating voltage is applied to the voltage detection IC 1.

The output of the voltage detection IC 1 and the pull-up resistor R3 are connected to the Terminal C, and the pull-up resistor R3 is also connected to the terminal A to which the voltage Va is applied.

By the use of the pull-up resistor R3, when the input voltage of the voltage detection IC 1 is higher than the detection voltage, the voltage at the level of "H" is output at the terminal C, and when input voltage is lower than the detection voltage, the level "L" is output at the terminal C.

The operation is described in more detail with reference to FIGS. 2A, 2B, and 2C, which show the changes of the input and output voltages of the voltage detection circuit 2 shown in FIG. 1. FIG. 2A shows the input voltage Vb and the voltage Vd generated by division by means of resistors R1 and R2. FIG. 2B shows the input voltage to the voltage detection IC 1. FIG. 2C shows an output voltage of the voltage detection IC 1 which appears at the terminal C.

It is assumed as an example in FIGS. 2A, 2B and 2C, the detection voltage of the voltage detection IC 1 is 2.5 V, the minimum operating voltage is 0.5 V, the voltage at the terminal A is 3.5 V, and the voltage Vd is 1.5 V.

Here, the region a is the region wherein the voltage Vb is higher than the detection voltage of the voltage detection IC 1. When the voltage Vb is higher than the voltage Vd, the voltage input in the voltage detection Ic1 is Vb.

Since the input voltage Vb is higher than the detection voltage of the voltage detection IC 1, the voltage at the level of "H" is output at the terminal C. The voltage appearing at the terminal C is Va because of the pull-up resistor R3.

The region b is the region wherein the voltage Vb is lower than the detection voltage of the voltage detection IC 1 and is higher than the voltage Vd. When the voltage Vb is higher than the voltage Vd, the voltage input in the voltage detection IC 1 becomes Vb. Since the input voltage Vb is lower than the detection voltage of the voltage detection Ic 1, the voltage at the level of "L" is output at the terminal C.

The region c is the region wherein the voltage Vb is lower than the voltage Vd and is higher than the minimum operating voltage of the voltage detection IC1. When the voltage Vb is lower than the voltage Vd, the voltage input in the voltage detection IC 1 becomes Vd. Since the input voltage Vd is lower than the detection voltage of the voltage detection IC 1, the voltage at the level of "L" is output at the terminal C.

The region d is the region wherein the voltage Vb is lower than the minimum operating voltage of the voltage detection IC 1. When the voltage Vb is lower than the voltage Vd, the voltage input in the voltage detection IC 1 becomes Vd. Since the input voltage Vd is lower than the detection voltage of the voltage detection IC 1, the voltage at the level of "L" is output at the terminal C.

The region e is the region, similar to the region c, wherein the voltage Vb is lower than the voltage Vd, and is higher than the minimum operating voltage of the voltage detection IC1. When the voltage Vb is lower than the voltage Vd, the voltage input into the voltage detection IC 1 becomes Vd. Since the input voltage Vd is lower than the voltage detection IC 1, the "L" level voltage is output at the terminal C.

The region f is, similar to the region b, the region wherein the voltage Vb is lower than the detection voltage of the voltage detection IC 1, and higher than the voltage Vd.

When the voltage Vb is higher than the voltage Vd, the voltage input into the voltage detection IC1 becomes Vb. Since the input voltage Vb is lower than the detection voltage of the voltage detection IC 1, the voltage at the level of "L" is output.

The region g is, similar to the region a, the region wherein the voltage Vb is higher than the detection voltage of the voltage detection IC 1, and higher than the voltage Vd.

When the voltage Vb is higher than the voltage Vd, the voltage input into the voltage detection IC1 becomes Vb. Since the input voltage Vb is lower than the detection voltage of the voltage detection IC 1, the voltage at the level of "H" is output. The voltage appearing at the terminal C becomes Va by the pull-up resistor R3.

The result of the output of the voltage detection IC 1 is shown in FIG. 2C. Changes of the output of the voltage detection IC are only observed in the areas between the regions a and b and areas between the regions f and g. In these regions, the voltage Vb is input, so that the voltage detection of the voltage Vb at the measuring terminal can be carried out correctly.

In the area ranging over the regions c to e, since the voltage input into the voltage detection IC 1 is Vd, and since the voltages Vb and Vd are lower than the detection voltage of the voltage detection IC 1, the result of detection at the terminal C will be the same, even though either one is input into the voltage detection IC 1.

In the region d, the voltage Vb becomes lower than the minimum operating voltage of the voltage detection IC 1, so that the voltage detection IC 1 will incur a malfunction, when the voltage Vb is directly input into the IC 1. However, it becomes possible to operate the voltage detection IC and to detect a low voltage by inputting a voltage Vd which is lower than the detection voltage and is higher than the minimum operating frequency of the voltage detecting IC 1.

In a practical circuit, it is necessary to take the voltage drop of the diode into consideration. It is noted that the voltage Vb at the terminal B is made up by addition of the detection voltage of the voltage detection IC 1 with the voltage drop.

On the other hand, the voltage difference between the detection voltage of the voltage detection IC 1 and the minimum operating voltage of the voltage detection IC 1 can be expanded by selecting a diode having a small voltage drop, so that it becomes possible to increase a degree of freedom in setting constants of resistors R1 and R2.

Hereinafter, the second embodiment of the present invention is described with reference to FIG. 3, which is a circuit diagram showing the second embodiment of the present invention.

Figure 3:
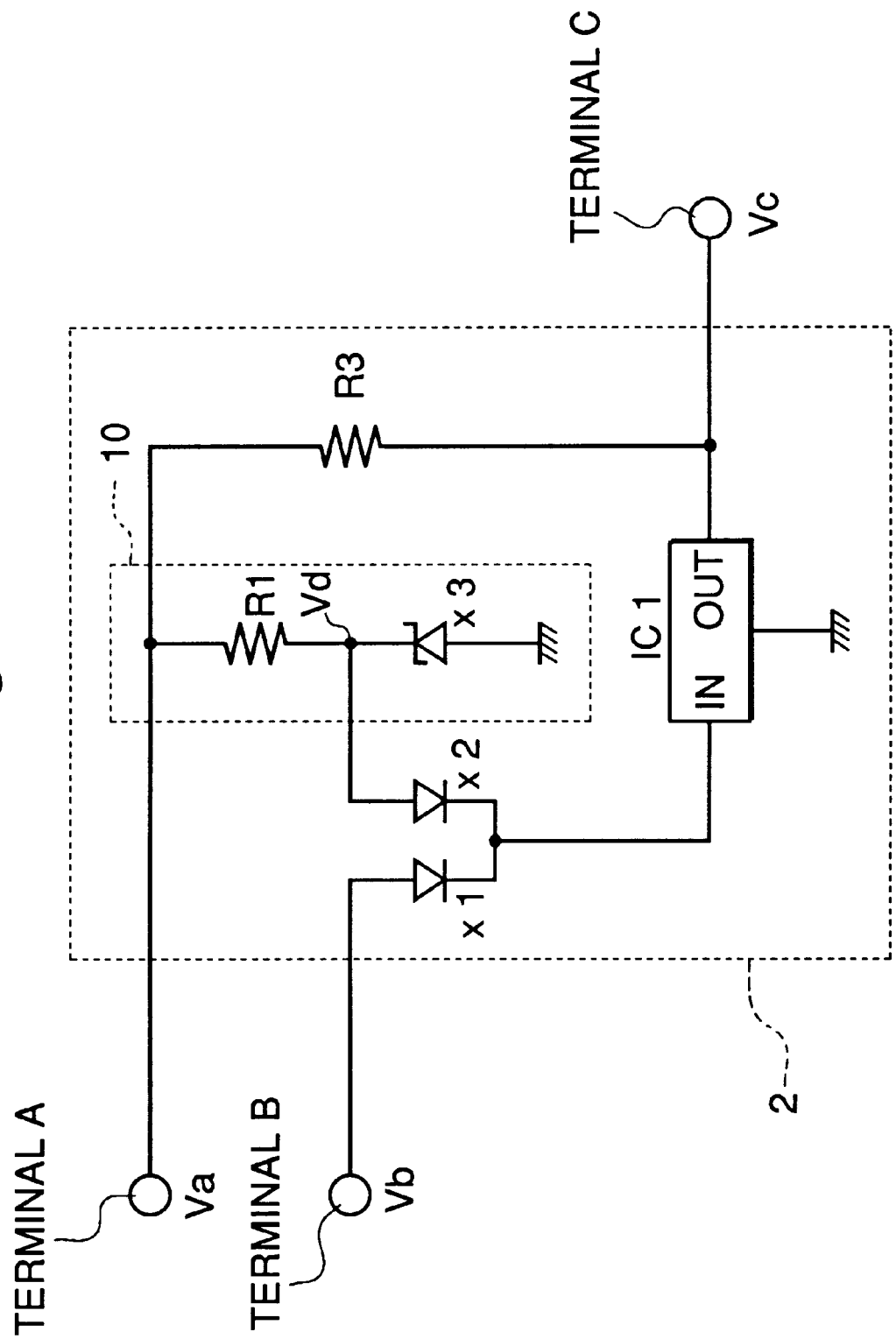
FIG. 3 is a circuit diagram showing the structure of a voltage detection circuit according to the second embodiment of the present invention.

As clearly shown by a comparison between FIG. 3 with FIG. 1, the second embodiment differs from the first embodiment in that the second embodiment has a voltage regulator diode X3 connected in series with the resistor X1, and the diode X3 and the resistor R1 are connected between the terminal A and the GND, replacing with R2 of the voltage divider circuit shown in said FIG. 1.

The other portions are the same as that of FIG. 1 and the same elements are referred to as the same reference number and their second explanations are omitted.

In the second embodiment, the voltage regulator diode X3 exhibits a standard voltage at both ends of this diode, by flowing current, if the excessive voltage is applied in the opposite direction.

By setting this voltage of the voltage regulator diode X3 less than the detection voltage of the voltage detection circuit and higher than the minimum operating voltage, the same operation will result as that of the circuit shown in FIG. 1.

Since the voltage generated at both ends of the voltage regulator diode X3 is constant, and even if the voltage Va of the standard voltage source fluctuates for any reason, the resistor R1 can absorb the fluctuation, which results in maintaining the voltage Vd at constant.

It is the advantageous feature that, by the use of the voltage regulator diode X3, the circuit according to the second embodiment is more stable against the influence of the voltage fluctuation of the standard voltage source.

As hereinabove described, the voltage detection circuit by the present invention is designed such that the higher voltage among two voltages are input into the voltage detection circuit, and by use of a voltage which is lower than the detection voltage of the voltage detection IC and is higher than the minimum operating voltage, and the input voltage into the voltage detection IC is higher than the minimum operating voltage of the voltage detection IC, so that it is possible to detect the voltage correctly without being subjected to malfunction, even if the voltage at the voltage detecting terminal is less than the minimum operating voltage of the voltage detection IC.

Therefore, even when a voltage at the voltage detecting terminal is less than the minimum operating frequency, that is, when an electric cell is exhausted, or when the electric cell is not connected, it is possible to execute the correct detection of low voltage.

What is claimed is:

1. A voltage detection circuit comprising:
    a voltage detection IC for comparing an input voltage with a detection voltage, said voltage detection IC outputting a value indicative of a state of operation of an external circuit based on said comparison; and
    a voltage selection circuit for selecting one of two voltages as said input voltage into said voltage detection IC, wherein a first voltage of said two voltages derives from said external circuit and a second voltage of said two voltages is derived from said detection voltage having a predetermined voltage lying between a minimum operating voltage of said voltage detection IC and said detection voltage,
    wherein said voltage selection circuit selects said first voltage for input into the voltage detection IC when said first voltage is above said minimum operating voltage, and selects said second voltage for input into the voltage detection IC when said first voltage is below said minimum operating voltage.

2. A voltage detection circuit according to claim 1, wherein said voltage selection circuit comprises:
    a first diode for conducting said first voltage applied from said external circuit; and
    a second diode for conducting said second voltage, said second diode connected to said first diode to form a diode OR circuit.

3. A voltage detection circuit according to claim 2, wherein said first diode prevents a current from said detection voltage from which said second voltage is derived from flowing to said external circuit.

4. A voltage detection circuit according to claim 2, wherein said second diode prevents a current from said external circuit from flowing to said detection voltage from which said second voltage is derived.

5. A voltage detection circuit according to claim 2, further comprising:
    a voltage divider circuit for dividing said detection voltage, said second voltage corresponding to said divided voltage output from the voltage divider circuit.

6. A voltage detection circuit according to claim 5, wherein the voltage divider circuit includes a plurality of resistors connected in series between said detection voltage and ground.

7. A voltage detection circuit according to claim 5, wherein said voltage divider circuit includes in series a resistor and a voltage regulator diode between said detection voltage and ground.

8. A voltage detection circuit according to claim 1, wherein said external circuit is a power source.

9. A voltage detection circuit according to claim 1, wherein said second voltage derives from said detection voltage.

10. A voltage detection circuit according to claim 1, wherein the voltage detection IC outputs a signal indicative of a first state of operation of said external circuit when the voltage detection IC detects that said input voltage is greater than the detection voltage, and wherein the voltage detection IC outputs a signal indicative of a second state of operation of said external circuit when the voltage detection IC detects that said input voltage is less than the detection.

11. A voltage detection circuit as recited in claim 10, wherein said first state of operation corresponds to an acceptable state of operation of said external circuit, and wherein said second state of operation corresponds to an unacceptable state of operation of said external circuit.

12. A voltage detection circuit according to claim 2, wherein said diode OR circuit passes a greater of said first voltage and said second voltage to said voltage detection IC.

13. A method for detecting a state of operation of a circuit, comprising:
    inputting a first voltage derived from said circuit;
    generating a second voltage from a detection voltage lying between a minimum operating voltage and said detection voltage;
    selecting one of said first voltage and said second voltage, said selecting step including (a) selecting said first voltage when said first voltage is above said minimum operating voltage and (b) selecting said second voltage when said first voltage is below said minimum operating voltage;
    comparing said voltage selected in said selecting step with a detection voltage; and
    outputting a value indicative of a state of operation of said circuit based on an outcome of said comparing step.

14. A method according to claim 13, wherein said circuit is a power source.

15. A method according to claim 13, wherein said second voltage derives from detection voltage.

16. A voltage detection circuit comprising:
    a voltage selection circuit for selecting the higher of a voltage to be measured and a predetermined reference voltage; and
    a voltage detection IC for outputting a voltage, the level of which is set according to a comparison between the voltage selected by said voltage selection circuit and a predetermined detection voltage,
    wherein said reference voltage is lower than said detection voltage of said voltage detection IC and higher than a minimum operating voltage of said voltage detection IC.

17. A voltage detection circuit according to claim 16, wherein said voltage selection circuit comprises:
    a first diode to conduct said voltage to be measured; and
    a second diode for constructing a diode OR circuit with said first diode by conducting said reference voltage.

18. A voltage detection circuit according to claim 17, wherein said first diode prevents a current from flowing from an input side for said reference voltage to an input side for said voltage to be measured.

19. A voltage detection circuit according to claim 17, wherein said second diode prevents a current from flowing from an input side for said voltage to be measured to an input side for said reference voltage.

20. A voltage detection circuit according to claim 17, wherein said reference voltage is generated by a voltage divider circuit connected between said detection voltage source and ground.

21. A voltage detection circuit according to claim 20, wherein said voltage divider circuit is constructed by connecting a plurality of resistors in series between said detection voltage and the ground.

22. A voltage detection circuit according to claim 20, wherein said voltage divider circuit is constructed by connecting in series a resistor and a voltage regulator diode between said detection voltage and the ground.

* * * * *